(12) United States Patent
Kozawa et al.

(10) Patent No.: US 8,956,458 B2
(45) Date of Patent: Feb. 17, 2015

(54) VAPOR DEPOSITION DEVICE AND VAPOR DEPOSITION METHOD

(75) Inventors: Takahiro Kozawa, Nagoya (JP); Kenji Nakashima, Nisshin (JP); Keeyoung Jun, Nisshin (JP); Takahiro Ito, Toyota (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 14/001,797

(22) PCT Filed: Aug. 31, 2011

(86) PCT No.: PCT/JP2011/069763
§ 371 (c)(1),
(2), (4) Date: Oct. 22, 2013

(87) PCT Pub. No.: WO2012/117590
PCT Pub. Date: Sep. 7, 2012

(65) Prior Publication Data
US 2014/0038395 A1 Feb. 6, 2014

(30) Foreign Application Priority Data
Feb. 28, 2011 (JP) ................. 2011-042290

(51) Int. Cl.
C23C 16/00 (2006.01)
H01L 21/02 (2006.01)
C01B 33/027 (2006.01)
C01B 33/029 (2006.01)
(Continued)

(52) U.S. Cl.
CPC .......... *H01L 21/0262* (2013.01); *C01B 33/027* (2013.01); *C01B 33/029* (2013.01); *C23C 16/24* (2013.01); *C23C 16/452* (2013.01); *C23C 16/45561* (2013.01); *H01L 21/02532* (2013.01); *H01L 21/0237* (2013.01)
USPC ............ 118/724; 118/715; 118/726; 438/478

(58) Field of Classification Search
CPC ............................... H01L 21/02; C23C 16/24
USPC .................. 118/715, 724, 726, 696; 156/345; 438/478
See application file for complete search history.

(56) References Cited

U.S. PATENT DOCUMENTS 5,483,918 A 1/1996 Kobayashi et al.
5,868,833 A * 2/1999 Habuka ........................ 117/84
(Continued)

FOREIGN PATENT DOCUMENTS

JP 05-58789 A 3/1993
JP 09-235194 A 9/1997
(Continued)

*Primary Examiner* — Caleb Henry
(74) *Attorney, Agent, or Firm* — Sughrue Mion, PLLC

(57) ABSTRACT

A vapor deposition device includes a vapor deposition chamber, a heating chamber, a mixing chamber, a first reservoir for storing trichlorosilane gas, and a second reservoir for storing silane gas that reacts with hydrochloric acid gas. The heating chamber communicates with the first reservoir and the mixing chamber, heats the trichlorosilane gas and then supplies the heated gas to the mixing chamber. The mixing chamber communicates with the second reservoir and the vapor deposition chamber, mixes the heated gas supplied from the heating chamber and the silane gas and then supplies the mixed gas to the vapor deposition chamber. A temperature in the heating chamber is higher than a temperature in the mixing chamber.

4 Claims, 2 Drawing Sheets

(51) Int. Cl.
*C23C 16/24* (2006.01)
*C23C 16/452* (2006.01)
*C23C 16/455* (2006.01)

(56) References Cited

U.S. PATENT DOCUMENTS

| | | | | |
|---|---|---|---|---|
| 5,884,009 | A * | 3/1999 | Okase | 392/418 |
| 6,217,659 | B1 | 4/2001 | Botelho et al. | |
| 6,432,838 | B1 * | 8/2002 | Choi et al. | 438/758 |
| 7,485,189 | B2 * | 2/2009 | Satake et al. | 118/689 |
| 8,153,281 | B2 * | 4/2012 | Selvamanickam et al. | 428/701 |
| 8,591,993 | B2 * | 11/2013 | Higashi et al. | 427/255.5 |
| 8,815,711 | B2 * | 8/2014 | Suzuki et al. | 438/478 |
| 2001/0009138 | A1 * | 7/2001 | Botelho et al. | 118/715 |
| 2002/0009868 | A1 | 1/2002 | Tobashi et al. | |
| 2002/0054956 | A1 | 5/2002 | Botelho et al. | |
| 2004/0147138 | A1 * | 7/2004 | Vaartstra | 438/785 |
| 2006/0216952 | A1 * | 9/2006 | Bhanap et al. | 438/780 |
| 2007/0144438 | A1 * | 6/2007 | Vaartstra | 118/715 |
| 2008/0102629 | A1 * | 5/2008 | Vaartstra | 438/680 |
| 2009/0042321 | A1 * | 2/2009 | Sasaki et al. | 438/10 |
| 2009/0111278 | A1 * | 4/2009 | Yajima et al. | 438/758 |
| 2009/0258504 | A1 * | 10/2009 | Nakaiso et al. | 438/758 |
| 2009/0291566 | A1 * | 11/2009 | Ueno et al. | 438/758 |
| 2009/0324826 | A1 * | 12/2009 | Kato et al. | 427/255.28 |
| 2010/0112744 | A1 * | 5/2010 | Molnar | 438/57 |
| 2011/0155060 | A1 * | 6/2011 | Zhang et al. | 118/723 R |
| 2012/0052657 | A1 * | 3/2012 | Taniyama et al. | 438/478 |
| 2012/0192789 | A1 * | 8/2012 | Kramer et al. | 118/712 |
| 2012/0220137 | A1 * | 8/2012 | Ota et al. | 438/765 |
| 2012/0244684 | A1 * | 9/2012 | Suzuki et al. | 438/478 |
| 2013/0149872 | A1 * | 6/2013 | Hirose et al. | 438/762 |
| 2013/0252434 | A1 * | 9/2013 | Yuasa et al. | 438/758 |
| 2013/0295401 | A1 * | 11/2013 | Urushihara et al. | 428/544 |
| 2014/0130742 | A1 * | 5/2014 | Kang et al. | 118/724 |
| 2014/0302687 | A1 * | 10/2014 | Ashihara et al. | 438/780 |

FOREIGN PATENT DOCUMENTS

| | | |
|---|---|---|
| JP | 2000-223431 A | 8/2000 |
| JP | 2001-351864 A | 12/2001 |
| JP | 2009-105328 A | 5/2009 |
| JP | 2009-135230 A | 6/2009 |

* cited by examiner

VAPOR DEPOSITION DEVICE AND VAPOR DEPOSITION METHOD

CROSS REFERENCE TO RELATED APPLICATIONS

This is a National Stage of International Application No. PCT/JP2011/069763, filed Aug. 31, 2011, claiming priority from Japanese Patent Application No. 2011-042290, filed Feb. 28, 2011, the contents of all of which are incorporated herein by reference in their entirety.

TECHNICAL FIELD

This application claims priority based on Japanese Patent Application No. 2011-042290 filed on Feb. 28, 2011, the entire contents of which are incorporated herein by reference. This application relates to a vapor deposition device and a vapor deposition method for depositing a silicon film on the surface of a substrate.

BACKGROUND ART

There is known a vapor deposition device that deposits a silicon film on the surface of a substrate. Japanese Patent Application Laid-Open No. 2009-105328 discloses a technique for crystal-growing a silicon film on the surface of a substrate using a vapor deposition device. In the technique disclosed in Japanese Patent Application Laid-Open No. 2009-105328, silane chloride gas, which is raw material gas, is supplied to a vapor deposition chamber to crystal-grow a silicon film on the surface of the substrate. In Japanese Patent Application Laid-Open No. 2009-105328, nichlorosilane ($SiHCl_3$) gas is described as an example of the silane chloride gas.

The trichlorosilane ($SiHCl_3$) gas decomposes to thereby generate dichloride silicon ($SiCl_2$) gas and hydrochloric acid (HCl) gas. This decomposition becomes more active as the temperature of the $SiHCl_3$ gas rises. When Si atoms of the $SiCl_2$ gas combine with the surface of a substrate, a silicon film crystal-grows on the surface of the substrate.

When the silicon film crystal-grows on the surface of the substrate, the $SiHCl_3$ gas is consumed and the concentration of the HCl gas relatively rises. Therefore, when the crystal growth of the silicon film advances, a reaction in the opposite direction of the decomposition reaction occurs and the growing speed of the silicon film falls.

SUMMARY OF INVENTION

The $SiHCl_3$ gas can be acquired more inexpensively than other silane chloride gases. However, when the $SiHCl_3$ gas is used as raw material gas, the growing speed of the silicon film cannot be increased because of the reason explained above. It is an object of the technique disclosed in this specification to provide a technique for increasing the speed of crystal growth of the silicon film while using the $SiHCl_3$ gas as the raw material gas.

A vapor deposition device disclosed in this specification is characterized by decomposing the $SiHCl_3$ gas to generate $SiCl_2$ gas and HCl gas and then adding silane gas, which reacts with the HCl gas, to the gases. Consequently, a fall in the growing speed of the silicon film is suppressed by maintaining low concentration of the HCl gas.

The vapor deposition device disclosed in this specification is a vapor deposition device for depositing a silicon film on the surface of a substrate. The vapor deposition device includes a vapor deposition chamber, a heating chamber, a mixing chamber, a first reservoir for storing $SiHCl_3$ gas, and a second reservoir for storing silane gas that reacts with HCl gas. The heating chamber communicates with the first reservoir and the mixing chamber, heats the $SiHCl_3$ gas supplied from the first reservoir and then supplies the heated gas to the mixing chamber. The mixing chamber communicates with the second reservoir and the vapor deposition chamber, mixes the heated gas supplied from the heating chamber and the silane gas and then supplies the mixed gas to the vapor deposition chamber. A temperature in the heating chamber is higher than a temperature in the mixing chamber.

In the vapor deposition device, the $SiHCl_3$ gas is heated in the heating chamber to thereby be decomposed into $SiCl_2$ gas and HCl gas. In the mixing chamber, the silane gas reacts with the HCl gas to reduce the concentration of the HCl gas generated in the heating chamber. At this point, the concentration of the $SiCl_2$ gas does not decrease. Gas with the high concentration of the $SiCl_2$ gas and the low concentration of the HCl gas can be supplied to the vapor deposition chamber. As a result, it is possible to maintain the low concentration of the HCl gas. Therefore, it is possible to suppress a fall in the growing speed of the silicon film.

It is preferable that the silane gas is dichlorosilane ($SiH_2Cl_2$) gas. The $SiH_2Cl_2$ gas not only reacts with the HCl gas but also decomposes to thereby generate $SiCl_2$ gas and hydrogen ($H_2$) gas. Therefore, it is possible to further increase the concentration of the $SiCl_2$ gas supplied to the vapor deposition chamber and further increase the growing speed of the silicon film.

It is preferable that the heating chamber includes a heating unit that heats the $SiHCl_3$ gas to 700 to 1000° C. Decomposition of the $SiHCl_3$ gas becomes more active as a temperature rises. As the $SiHCl_3$ gas is heated to a higher temperature in the heating chamber, it is possible to generate a larger amount of the $SiHCl_3$ gas. Therefore, a temperature for heating the $SiHCl_3$ gas is desirably equal to or higher than 700° C. When the temperature for the heating in the heating chamber is equal to or lower than 1000° C., a reaction in which a product generated by the HCl gas and the silane gas decomposes into the HCl gas and the silane gas can be suppressed. Therefore, it is possible to maintain the low concentration of the HCl gas.

A method of depositing a silicon film disclosed in this specification includes: heating trichlorosilane gas; causing silane gas to react with the heated gas; and supplying the reacted gas to the surface of a substrate.

According to the technique disclosed in this specification, it is possible to increase crystal growth speed of the silicon film while using inexpensive raw material gas.

DESCRIPTION OF EMBODIMENTS

Several technical features disclosed in this specification are summarized below.

(Feature 1) A method of depositing a silicon film disclosed in this specification desirably includes heating and decomposing trichlorosilane ($SiHCl_3$) gas to generate dichloride silicon ($SiCl_2$) gas and hydrochloric acid (HCl) gas, mixing the generated HCl gas with the silane gas and causing the HCl gas to react with silane gas to relatively reduce the concentration of the HCl gas with respect to the concentration of the $SiCl_2$ gas, and supplying the mixed gas to the surface of a substrate.

(Feature 2) The temperature of gas in a mixing chamber is desirably 500 to 800° C. Since the decomposition of the $SiHCl_3$ gas is suppressed in the mixing chamber, it is possible to suppress the concentration of the HCl gas supplied into a vapor deposition chamber from increasing.

(Feature 3) A partition plate is desirably provided between a gas supply port and the substrate in the vapor deposition chamber of a vapor deposition device. In this case, the mixing chamber may be a space partitioned by the partition plate and a part of a wall of the vapor deposition chamber. A part of the vapor deposition chamber also functions as the mixing chamber. Therefore, it is unnecessary to separately provide the mixing chamber.

First Embodiment

Figure 1:
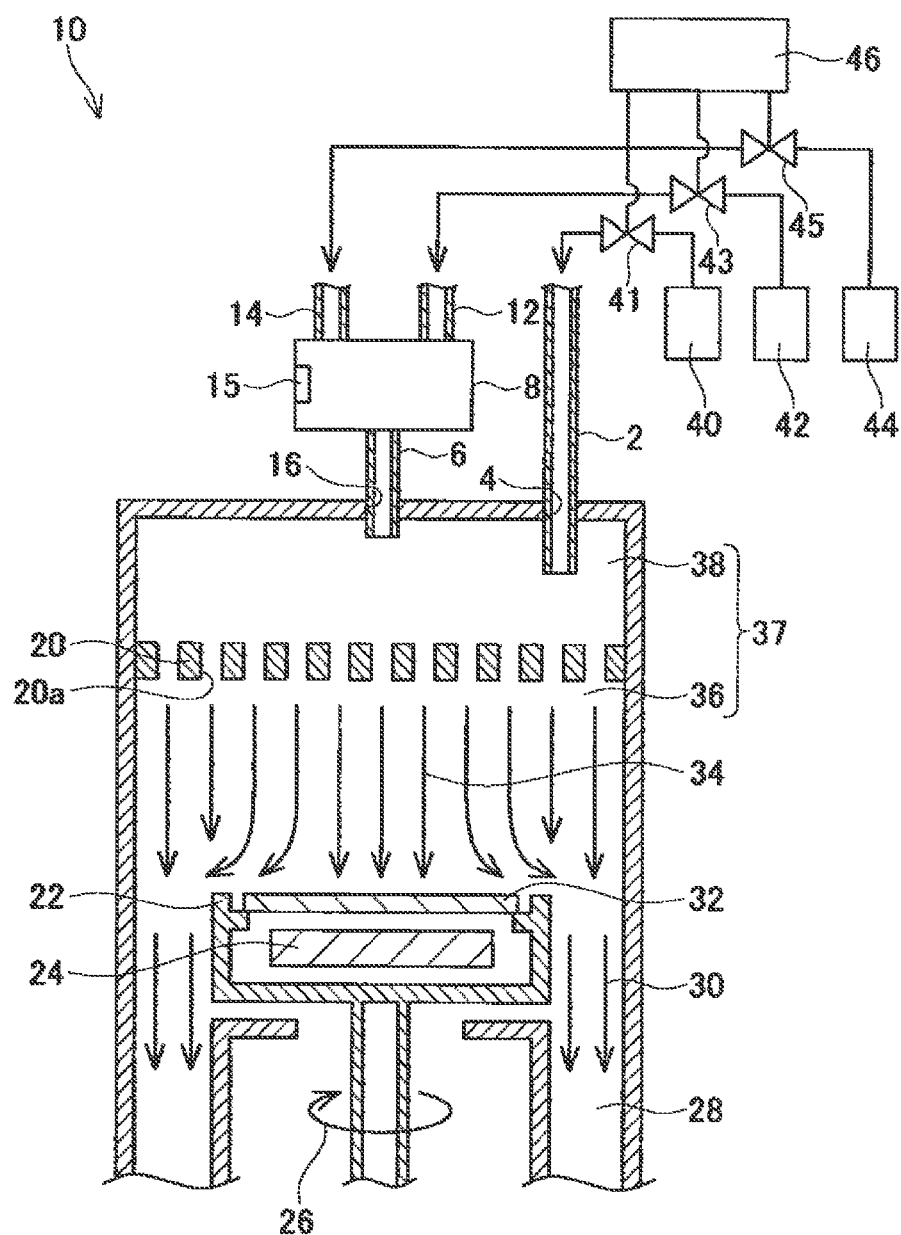
FIG. 1 shows a sectional view of a vapor deposition device according to a first embodiment.

As shown in FIG. 1, a vapor deposition device 10 includes a chamber 37, a heating chamber 8, a first reservoir 42, a second reservoir 40, and a third reservoir 44. The chamber 37 includes a vapor deposition chamber 36 and a mixing chamber 38. The vapor deposition chamber 36 and the mixing chamber 38 are partitioned by a partition plate 20. The partition plate 20 is provided between a substrate 32 and gas supply ports 16 and 4 provided in an upper part of the chamber 37. The partition plate 20 includes an opening 20a. A placing table 22 is provided in a lower part of the vapor deposition chamber 36. A heater 24 is provided on the inside of the placing table 22. The substrate 32 can be heated to a predetermined temperature. The placing table 22 can rotate in an arrow 26 direction. An exhaust port 28 is further provided in the lower part of the vapor deposition chamber 36. Exhaust gas 30 is discharged to the outside of the vapor deposition chamber 36 through the exhaust port 28. The mixing chamber 38 communicates with the second reservoir 40 via a communication path 2. The gas supply ports 16 and 4 are provided in the mixing chamber 38. The gas supply ports 16 and 4 are formed in a direction orthogonal to the surface of the substrate 32. The communication path 2 is fit in the gas supply port 4.

The heating chamber 8 communicates with the mixing chamber 38 via a communication path 6, communicates with the first reservoir 42 via a communication path 12, and communicates with the third reservoir 44 via a communication path 14. The communication path 6 is fit in the gas supply port 16 provided in the mixing chamber 38. A heating unit 15 that heats the inside of the heating chamber 8 is provided in the heating chamber 8. A heat exchanger or a sheath heater is desirably used as the heating unit 15.

$SiHCl_3$ gas is stored in the first reservoir 42. Dichlorosilane ($SiH_2Cl_2$) gas is stored in the second reservoir 40. Hydrogen ($H_2$) gas is stored in the third reservoir 44. Therefore, the $SiHCl_3$ gas from the first reservoir 42 and the $H_2$ gas from the third reservoir 44 are supplied to the heating chamber 8. A supply amount of the $SiHCl_3$ gas is adjusted by a valve 43. A supply amount of the $H_2$ gas is adjusted by a valve 45. The $SiHCl_3$ gas is raw material gas of a silicon film. The $H_2$ gas is a carrier gas. The gas from the heating chamber 8 and the $SiH_2Cl_2$ gas from the second reservoir 40 are supplied to the mixing chamber 38. A supply amount of the $SiH_2Cl_2$ gas is adjusted by a valve 41. The $SiH_2Cl_2$ gas is raw material gas of the silicon film and is silane gas for reacting with the HCl gas. The gas supplied from the heating chamber 8 and the $SiH_2Cl_2$ gas supplied from the second reservoir 40 are mixed in the mixing chamber 38. A mixed gas 34 mixed in the mixing chamber 38 is supplied to the lower part of the vapor deposition chamber 36 through the opening 20a of the partition plate 20. Opening degrees of the valves 41, 43, and 45 are controlled by a control device 46. A temperature in the heating chamber 8 is input to the control device 46.

A reaction in which a silicon film crystal-grows on the surface of the substrate 32 is explained. The $SiHCl_3$ gas from the first reservoir 42 and the $H_2$ gas from the third reservoir 44 are supplied to the heating chamber 8. The control device 46 controls the opening degrees of the valves 43 and 45 and adjusts supply amounts of the $SiHCl_3$ gas and the $H_2$ gas. The $SiHCl_3$ gas supplied to the heating chamber 8 is heated to 700 to 1000° C. by the heating unit 15 and decomposes as indicated by Formula (1) below (a heating step). The reaction indicated by Formula (1) more easily occurs as a heating temperature of the $SiHCl_3$ gas rises and, in particular, becomes active when the heating temperature exceeds 900° C.

$$SiHCl_3 SiCl_2 \rightarrow SiCl_2 + HCl \qquad \text{Formula (1)}$$

The $SiHCl_3$ gas not decomposed in the heating chamber 8, the $SiCl_2$ gas generated in the heating chamber 8, and the HCl gas generated in the heating chamber 8 are supplied to the mixing chamber 38 together with the carrier gas (the $H_2$ gas). The $SiH_2Cl_2$ gas is supplied to the mixing chamber 38 from the second reservoir 40. The control device 46 controls the opening degree of the valve 41 according to a temperature in the heating chamber 8 and a supply amount of the $SiHCl_3$ gas supplied to the heating chamber 8 and adjusts a supply amount of the $SiH_2Cl_2$ gas to be supplied to the mixing chamber 38. In the mixing chamber 38, the gas supplied from the heating chamber 8 and the $SiH_2Cl_2$ gas supplied from the second reservoir 40 are mixed. The temperature of the mixed gas falls below the gas temperature in the heating chamber 8. Depending on the temperature of the gas supplied from the heating chamber 8, the temperature of the mixed gas in the mixing chamber 38 is 500 to 800° C. In the mixing chamber 38, reactions indicated by Formula (2) and Formula (3) below occur (a reacting step).

$$SiH_2Cl_2 + HCl \rightarrow SiHCl_3 + H_2 \qquad \text{Formula (2)}$$

$$SiH_2Cl_2 \rightarrow SiCl_2 + H_2 \qquad \text{Formula (3)}$$

Formula (2) indicates a reaction in which the HCl gas generated in the heating chamber 8 reacts with the $SiH_2Cl_2$ gas and the $SiHCl_3$ gas is generated. In Formula (2), the $SiH_2Cl_2$ gas acts as gas for reducing the concentration of the HCl gas. Consequently, the concentration of the $SiCl_2$ gas does not decrease and the concentration of the HCl gas decreases. As explained above, the reaction indicated by Formula (1) more easily occurs as the heating temperature of the $SiHCl_3$ gas rises. That is, as the heating temperature of the $SiHCl_3$ gas rises, the concentration of the HCl gas to be supplied to the mixing chamber 38 increases. However, the $SiH_2Cl_2$ gas in an amount corresponding to the temperature in the heating chamber 8 is supplied to the mixing chamber 38 by the control device 46. Therefore, it is possible to reduce the concentration of the HCl gas to desired concentration.

According to the reaction indicated by Formula (2), $SiHCl_3$ gas is generated anew in the mixing chamber 38. However, the temperature of the gas in the mixing chamber 38 is lower than the temperature of the gas in the heating chamber 8. Therefore, in the mixing chamber 38, the reaction indicated by Formula (1) less easily occurs than in the heating chamber 8 and generation of the HCl gas is suppressed. Therefore, mixed gas with the high concentration of the $SiCl_2$ gas and the low concentration of the HCl gas is supplied to the vapor deposition chamber 36.

In the mixing chamber 38, as indicated by Formula (3), a reaction in which the $SiH_2Cl_2$ gas decomposes into the $SiCl_2$ gas also occurs. Therefore, the $SiH_2Cl_2$ gas acts as gas for not only reducing the concentration of the HCl gas but also increasing the concentration of the $SiCl_2$ gas. When the mixed gas 34 reaches the surface of the substrate 32, Si atoms of the $SiCl_2$ gas in the mixed gas 34 combine with Si atoms in a surface layer section of the substrate 32 (a supplying step).

When the Si atoms of the $SiCl_2$ gas combine with the Si atoms of the surface layer section of the substrate 32, a reaction indicated by Formula (4) below occurs on the surface of the substrate 32. Formula (4) indicates that Cl atoms of $SiCl_2$ combined with the surface layer section of the substrate 32 react with the $H_2$ gas (the carrier gas) and the Si atoms remain on the surface of the substrate 32. A silicon film crystal-grows on the surface of the substrate 32 according to the reaction indicated by Formula (4). As indicated by Formula (4), when the silicon film crystal-grows on the surface of the substrate 32, the HCl gas is generated as a by-product.

$$SiCl_2 + H_2 \rightarrow Si + 2HCl \quad \text{Formula (4)}$$

On the surface of the substrate 32, a reaction indicated by Formula (5) below also occurs at a fixed rate in addition to the reaction indicated by Formula (4). The reaction indicated by Formula (5) is a reverse reaction of Formula (4). Formula (5) indicates that the silicon film crystal-grown on the surface of the substrate 32 is etched by the HCl gas. When the reaction indicated by Formula (5) becomes active, the speed of the crystal growth of the silicon film decreases. As it is evident from Formula (5), as the concentration of the gas in the vapor deposition chamber 36 increases, the reaction indicated by Formula (5) more easily occurs on the surface of the substrate 32 and the speed of the crystal growth of the silicon film decreases.

$$Si + 3HCl \rightarrow SiHCl_3 + H_2 \quad \text{Formula (5)}$$

In the vapor deposition device 10, as indicated by Formula (1), the $SiHCl_3$ gas decomposes into the $SiCl_2$ gas and the HCl gas in the heating chamber 8. Thereafter, as indicated by Formula (2), the HCl gas can be removed in the mixing chamber 38. Therefore, the reaction indicated by Formula (5) less easily occurs and the growing speed of the silicon film can be increased. In the mixing chamber 38, $SiHCl_3$ gas is generated anew according to the reaction indicated by Formula (2). However, since the temperature of the mixing chamber 38 is lower than the temperature of the heating chamber 8, the decomposition of the $SiHCl_3$ gas is suppressed and the generation of the HCl gas is suppressed.

Second Embodiment

Figure 2:
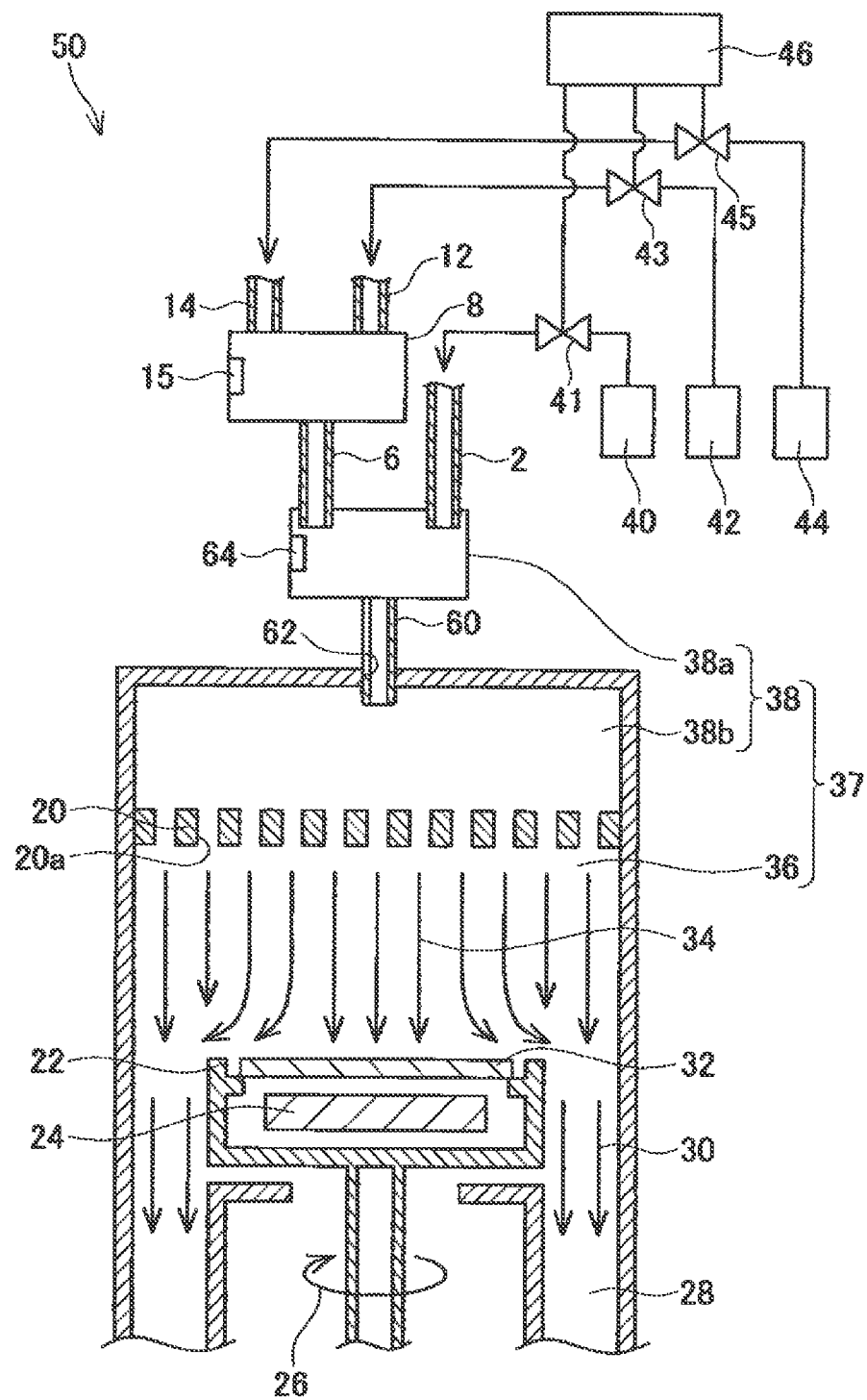
FIG. 2 shows a sectional view of a vapor deposition device according to a second embodiment.

As shown in FIG. 2, in a vapor deposition device 50, a cooling chamber 38a is provided on the outside of the chamber 37. In the cooling chamber 38a, a cooling unit 64 that cools the inside of the cooling chamber 38a is provided. As the cooling unit 64, a heat exchanger or a Peltier element is desirably used. A gas supply port 62 is provided in an upper part of the chamber 37. A communication path 60 is fit in the gas supply port 62. The cooling chamber 48 and a mixing chamber 38b communicate with each other via a communication path 60. Gas from the heating chamber 8 and $SiH_2Cl_2$ gas from the second reservoir 40 are supplied to the cooling chamber 38a. In the cooling chamber 38a, the gas supplied from the heating chamber 8 and the $SiH_2Cl_2$ gas supplied from the second reservoir 40 are cooled while being mixed. Therefore, the cooling chamber 38a and the mixing chamber 38b can be collectively regarded as the mixing chamber 38.

As explained above, in the vapor deposition device 50, the gas in the mixing chamber 38 can be cooled by the cooling unit 64. Even if the temperature of the gas supplied from the heating chamber 8 is high, the temperature of the gas in the mixing chamber 38 can be adjusted to a desired temperature. In the cooling chamber 38a, for example, the mixed gas of the gas supplied from the heating chamber 8 and the $SiH_2Cl_2$ gas supplied from the second reservoir 40 is cooled to 500 to 800° C. It is possible to more surely suppress the $SiHCl_3$ gas generated according to Formula (2) from decomposing into the $SiCl_2$ gas and the HCl gas again.

In the embodiments explained above, an example in which the $SiH_2Cl_2$ gas is used as the silane gas that reacts with the HCl gas is explained. Instead of the $SiH_2Cl_2$ gas, for example, monosilane ($SiH_4$) gas, disilane ($Si_2H_6$) gas, and monochlorosilane ($SiH_3Cl$) gas can also be used. When these gases are used, it is also preferable to set the temperature of the gas in the mixing chamber 38 lower than the temperature of the gas in the heating chamber 8. As explained above, the $SiH_2Cl_2$ gas not only removes the HCl gas but also generates the $SiCl_2$ gas through decomposition. Therefore, it is particularly preferable to use the $SiH_2Cl_2$ gas as the silane gas that reacts with the HCl gas. In addition to the gases in the embodiments, dopant gas of impurities may be supplied to the heating chamber 8 or the mixing chamber 38. If the dopant gas of impurities is supplied, it is possible to crystal-grow an n-type or p-type silicon film.

As the material of the substrate 32, silicon, aluminum nitride (AlN), sapphire ($Al_2O_3$), silicon carbide (SiC), spinel ($MgAlO_4$), group III nitride semiconductors (GaN, AlGaN, etc.) can be used. If silicon is used as the material of the substrate 32, since the material is the same as the material of the silicon film, deficiencies such as deformation less easily occur in the grown silicon film. If a material other than silicon is used as the material of the substrate 32, even if temperature for heating the substrate 32 is set near the melting point of silicon, deformation and the like less easily occur in the substrate 32. Therefore, it is possible to crystal-grow a high-quality silicon film. As the material other than silicon, aluminum nitride and silicon carbide are particularly preferable. The coefficients of thermal expansion of aluminum nitride and silicon carbide are close to the coefficient of thermal expansion of silicon. Therefore, it is possible to crystal-grow a higher-quality silicon film.

The specific examples of the present invention are specifically explained above. However, these specific examples are merely illustrations and do not limit the scope of claims. Various modifications and alterations of the specific examples illustrated above are included in the techniques described in claims. The technical elements explained in this specification or the drawings exhibit technical utility independently or through various combinations and are not limited to a combination described in claims as filed. The techniques illustrated in this specification or the drawings can simultaneously attain a plurality of objects, and attaining one of the objects per se offers technical utility.

The invention claimed is:

1. A vapor deposition device for depositing a silicon film on a surface of a substrate, the device comprising:
    a vapor deposition chamber;
    a heating chamber;
    a mixing chamber;
    a first reservoir for storing trichlorosilane gas; and
    a second reservoir for storing silane gas that reacts with hydrochloric acid gas,
    wherein the heating chamber communicates with the first reservoir and the mixing chamber, heats the trichlorosilane gas supplied from the first reservoir and then supplies the heated gas to the mixing chamber, the mixing chamber communicates with the second reservoir and the vapor deposition chamber, mixes the heated gas supplied from the heating chamber and the silane gas and then supplies the mixed gas to the vapor deposition chamber, and a temperature in the heating chamber is higher than a temperature in the mixing chamber.

2. The vapor deposition device according to claim 1, wherein the silane gas is dichlorosilane gas.

3. The vapor deposition device according to claim 1, wherein the heating chamber comprises a heating unit that heats the trichlorosilane gas to 700 to 1000 degrees Celsius.

4. The vapor deposition device according to claim 1, wherein the mixing chamber comprises a cooling unit that cools the mixed gas.

* * * * *